(12) United States Patent
Kim

(10) Patent No.: US 7,664,046 B2
(45) Date of Patent: Feb. 16, 2010

(54) MOBILE COMMUNICATIONS TERMINAL FOR SUPPORTING EXTENDED LINK ADAPTATION TECHNIQUES AND METHOD THEREOF

(75) Inventor: Ha-Sung Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 436 days.

(21) Appl. No.: 11/634,306

(22) Filed: Dec. 6, 2006

(65) Prior Publication Data
US 2007/0133620 A1 Jun. 14, 2007

(30) Foreign Application Priority Data
Dec. 7, 2005 (KR) .................. 10-2005-0119049

(51) Int. Cl.
*H04J 1/16* (2006.01)
(52) U.S. Cl. .................. 370/245; 370/252; 370/332; 370/232; 455/69; 455/522
(58) Field of Classification Search ............... 370/232, 370/245, 262, 333, 338, 349, 345, 347, 444, 370/282, 252, 522; 455/453, 522, 456, 69; 375/262
See application file for complete search history.

(56) References Cited
U.S. PATENT DOCUMENTS
6,430,722 B1 * 8/2002 Eroz et al. ............... 714/755
7,505,417 B2 * 3/2009 Huh et al. ............... 370/245
2003/0039270 A1 2/2003 Chang et al.
2005/0220040 A1 * 10/2005 Petrovic et al. ........... 370/278
2006/0190271 A1 * 8/2006 Kim et al. ............... 705/1

FOREIGN PATENT DOCUMENTS
EP 1255 368 A1 11/2002
KR 10-2001-0074385 A 8/2001
KR 10-0511314 B1 8/2005
WO WO-2004/062205 A 7/2007

OTHER PUBLICATIONS

Roongta et al., Wireless Information Networking Group, WCNC, IEEE Communications Society, vol. 4, pp. 2105-2109, Mar. 21, 2004.

* cited by examiner

*Primary Examiner*—Jason E Mattis
*Assistant Examiner*—Dady Chery
(74) *Attorney, Agent, or Firm*—Birch, Stewart, Kolasch & Birch, LLP

(57) ABSTRACT

A mobile communication terminal including a Central Processing Unit (CPU) configured to set at least one or more predetermined parameters according to communication channel states, and a Hybrid Automatic Repeat reQuest (HARQ) transmission/reception processor configured to process input data based on the set at least one or more predetermined parameters.

17 Claims, 7 Drawing Sheets

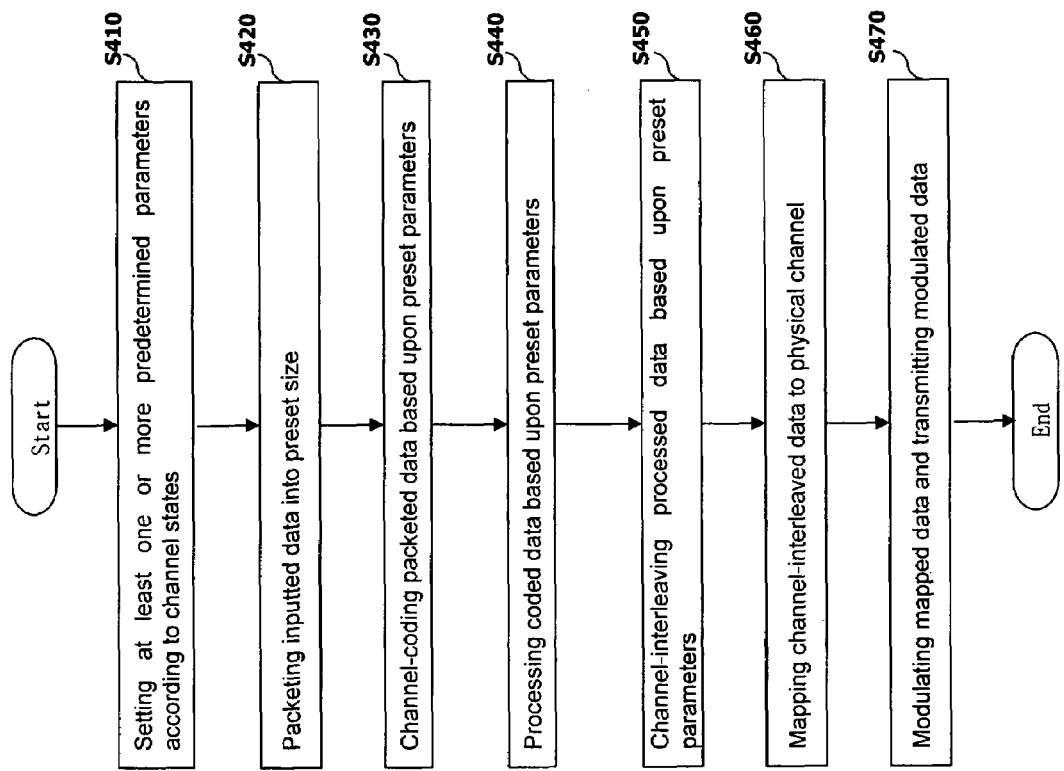

MOBILE COMMUNICATIONS TERMINAL FOR SUPPORTING EXTENDED LINK ADAPTATION TECHNIQUES AND METHOD THEREOF

RELATED APPLICATION

The present application claims priority to Korean Application No. 10-2005-0119049, filed on Dec. 7, 2005, which is hereby incorporated by reference in its entirety.

BACKGROUND OF THE INVENTION

1. Field of the Invention

The present invention relates to a mobile communication terminal and corresponding method that processes input data based at least one or parameters corresponding to changeful radio channel states.

2. Background of the Invention

A mobile communication terminal allows people to wirelessly communicate with each other via a communication network including a MSC (Mobile Switching Center) and a plurality of BSs (Base Stations). Mobile terminals also provide the user with the ability to transmit data including symbols, numerals and characters as well as multimedia data.

In addition, mobile terminals use a variety of different communication techniques such as the Code Division Multiple Access (CDMA) technique, Time Division Multiple Access (TDMA) technique, Frequency Division Multiple Access (FDMA) technique, and Global System for Mobile Communications (GSM) technique. Further, the International Telecommunication Union (ITU) has selected the International Mobile Telecommunication 2000 (IMT-2000) system as the third generation (3G) mobile communication system to provide improved multimedia services.

In more detailed, the 3G system increases the mobile terminal's capabilities to include services such as a wireless LAN, digital multimedia broadcast, portable Internet, etc. These additional services use a High Speed Downlink Packet Access (HSDPA) method that is based on the asynchronous IMT-2000. The HSDPA method increases the downlink transmission speed and thus decreases the transmission delay.

Turning now to FIG. 1, which illustrates a related art transmitting mobile communication terminal. As shown, the terminal includes a Central Processing Unit (CPU) 100 for controlling various units of the terminal, and a Cyclic Redundancy Checksum (CRC) unit 200 for adding CRC bits to input data and for packeting the data, a channel coder 300 for performing a channel coding process for the packeted data. Also included is a Hybrid Automatic Repeat request (HARQ) transmission and reception processors 410 and 420 for processing the coded data based on a preset Forward Error Correction (FEC) coding rate, channel interleavers 500 and 510 for channel-interleaving the processed data, a modulator 600 for modulating the interleaved data, and an antenna 700 for transmitting the modulated data.

In more detail, FIG. 2 illustrates processes performed by the transmitting terminal shown in FIG. 1. As shown, the input data is packeted into a preset size (S210). That is, the mobile terminal receives data to be transmitted and adds CRC bits used for error detection to thereby enable the packeting of the data to have the preset size. Then, a channel coding process is performed on the packeted data (S220), and the channel-coded data is processed according to a preset FEC coding rate (S230). That is, when transmitting the packeted data, the mobile terminal uses a preset FEC coding rate to thereby improve an error correction function.

Next, the processed data is subject to a channel interleaving process (S240). The mobile terminal interleaves the processed data to reduce the probable loss of the data during the data transmission. The channel-interleaved data is then mapped to a physical channel (S250), and the mapped data is modulated and then transmitted (S260). Further, the mobile terminal modulates the mapped data using a preset method such as the BPSK, QPSK, 8PSK, 16QAM, 64QAM methods to thereby allow the transmission of the modulated data to a receiving side mobile terminal.

However, the related art mobile terminal transmits the data using a preset FEC coding rate, etc. regardless of a channel state, which disadvantageously affects a communication quality when the state of the channel changes.

SUMMARY OF THE INVENTION

Accordingly, one object of the present invention is to address the above-noted and other problems.

Another object of the present invention is to provide a mobile communication terminal supporting extended link adaptation techniques and corresponding method that efficiently uses channels according to changeful radio channel states by varying at least one or more predetermined parameters according to the channel states.

To achieve these and other advantages and in accordance with the purpose of the present invention, as embodied and broadly described herein, the present invention provides in one aspect a mobile communication terminal including a Central Processing Unit (CPU) configured to set at least one or more predetermined parameters according to communication channel state, and a Hybrid Automatic Repeat request (HARQ) transmission/reception processor configured to process input data based on the set at least one or more predetermined parameters.

In another aspect, the present invention provides a mobile communication method, which includes setting at least one or more predetermined parameters according to communication channel state, and processing input data based on the set at least one or more predetermined parameters.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4 is a flowchart illustrating a method for supporting extended link adaptation techniques in accordance with an embodiment of the present invention;

DETAILED DESCRIPTION OF THE INVENTION

Figure 1:
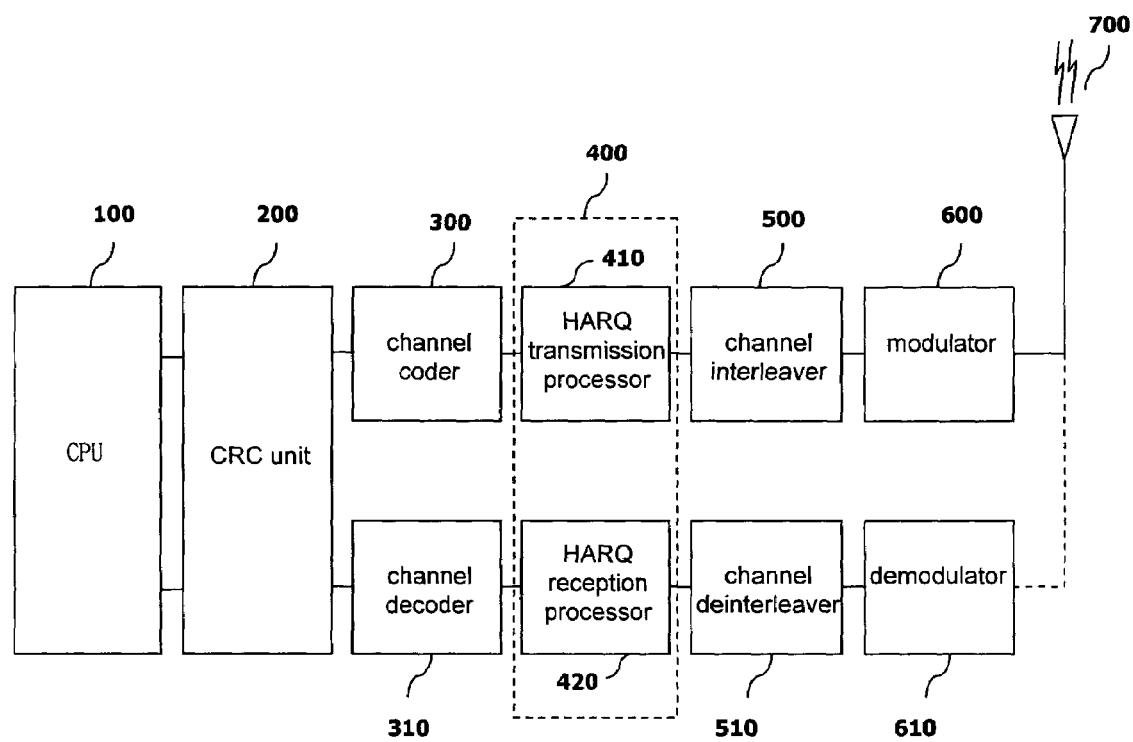
FIG. 1 is a block diagram illustrating a related art transmitting side mobile terminal.
Figure 2:
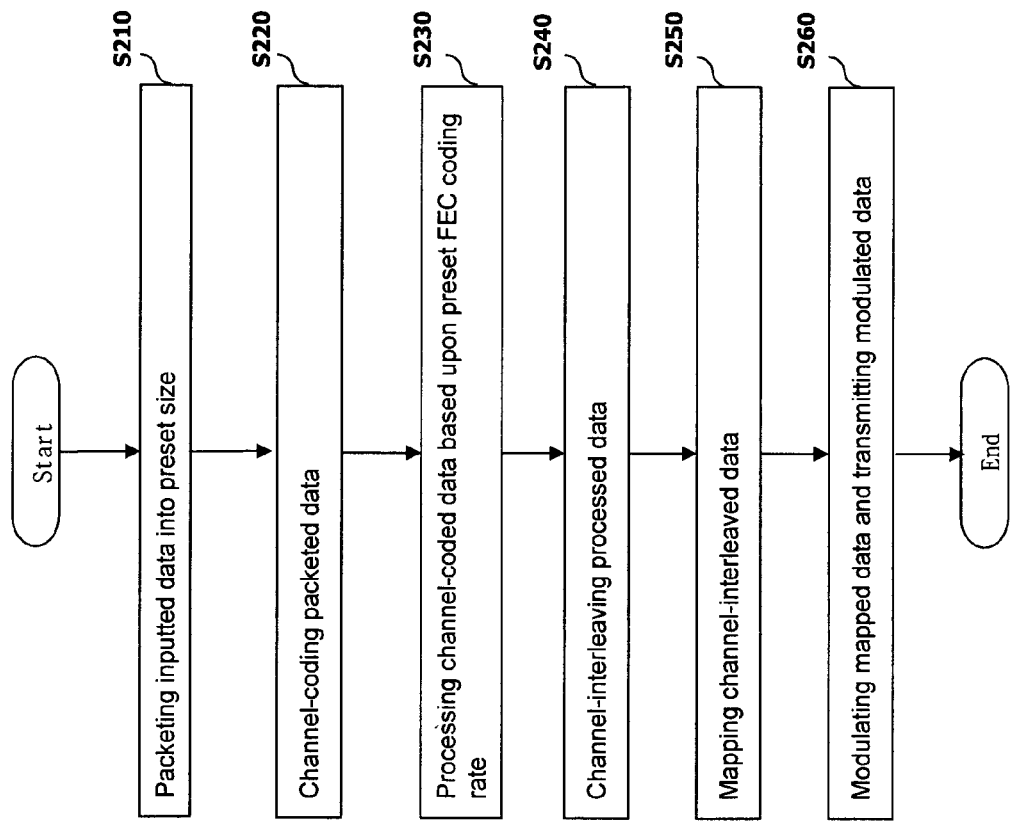
FIG. 2 is a flowchart illustrating a method for supporting link adaptation techniques according to the related art.
Figure 3:
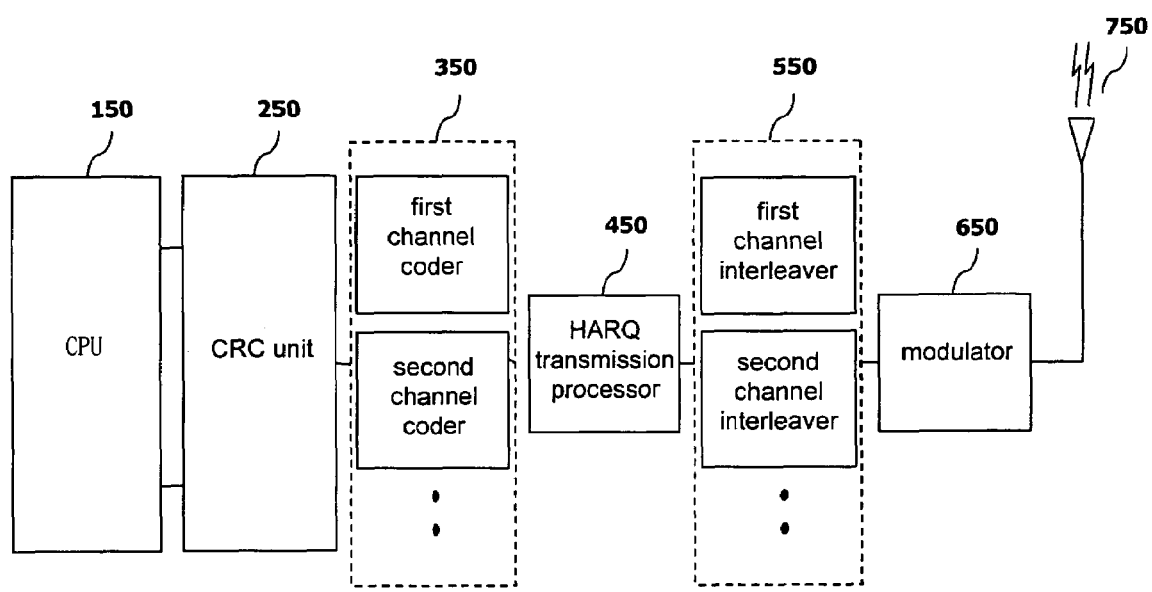
FIG. 3 is a block diagram illustrating a transmitting side mobile terminal for supporting extended link adaptation techniques in accordance with an embodiment of the present invention.

Reference will now be made in detail to the preferred embodiments of the present invention, examples of which are illustrated in the accompanying drawings. In more detail, FIG. 3 is a block diagram illustrating a transmitting side mobile terminal for supporting extended link adaptation techniques in accordance with an embodiment of the present invention.

As shown, the transmitting side mobile terminal includes a CPU 150 for setting at least one or more predetermined parameters according to channel states, a CRC unit 250 for adding CRC bits to input data to thereby packet the data having the CRC bits, a channel coding unit 350 including at least one or more channel coders for channel-coding the packeted data based upon the set parameters, a HARQ transmission processor 450 for processing the channel-coded data based on the set parameters, a channel interleaver unit 550 including at least one or more channel interleavers for channel-interleaving the processed data based on the set parameters, a modulator 650 for modulating the interleaved data, and an antenna 750 for transmitting the modulated data.

Turning next to FIG. 4, which is a flowchart illustrating a method for supporting extended link adaptation techniques in accordance with an embodiment of the present invention. FIG. 3 will also be referred to in this description.

As shown, the method includes first setting at least one or more predetermined parameters according to channel states (S410). That is, the CPU 150 sets at least one or more predetermined parameters according to a variety of channel states, and outputs the set parameters to the channel coding unit 350, the HARQ transmission processor 450 and the channel interleaver unit 550. In addition, the at least one or more set parameters include, for example, channel coders using different types of channels codes, a Forward Error Correction (FEC) coding rate, Rate Matching (RM) patterns, different types of channel interleavers, interleaving patterns, ARP types, etc.

Figure 5A:
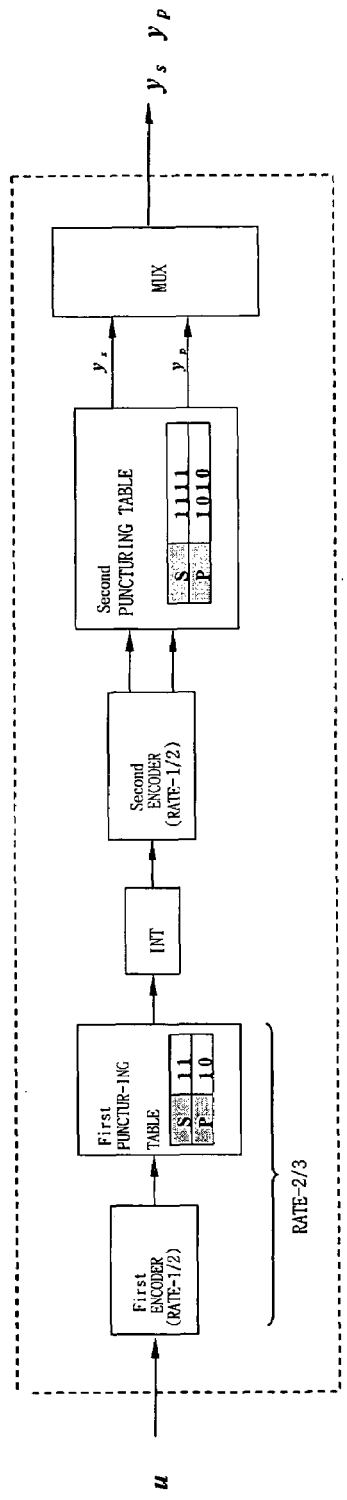
FIGS. 5A and 5B are block diagrams illustrating various channel coders of FIG. 3.
Figure 5B:
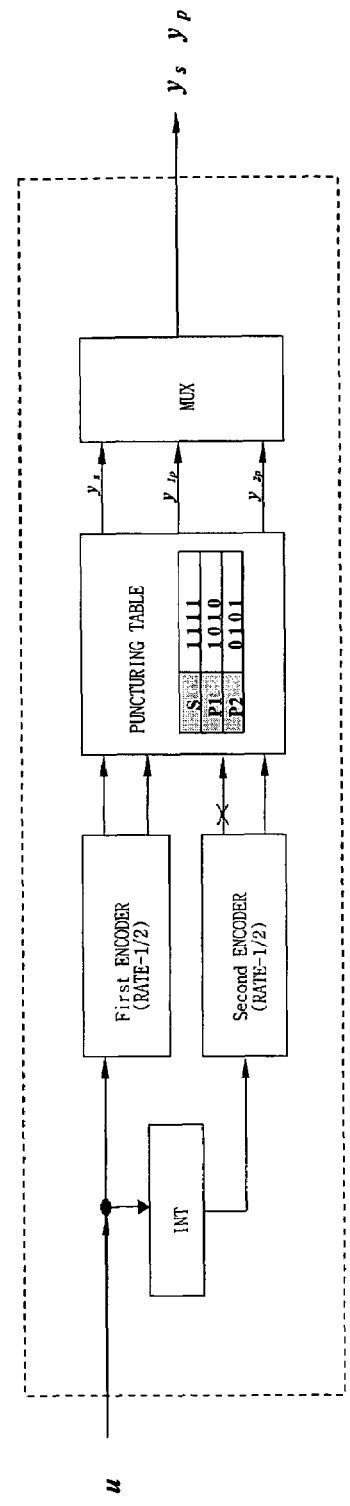

Then, the method packets the input data into a preset size (S420), and channel-codes the packeted data based on the set parameters (S430). That is, the CRC unit 250 receives data to be transmitted and adds CRC bits for error detection to thus enable a packeting of the data having the CRC bits into the preset size. Further, the at least one or more channel coders included in the channel coding unit 350 perform the channel coding process for the packeted data based upon the set parameters (S430). Here, the at least one or more channel coders use different channel codes such as the block Code (BC), Convolutional Code (CC), Turbo Code (TC), Serial Concatenated Convolutional Code (SCCC), Turbo-Like Code (TLC), etc. For example, FIG. 5A illustrates an SCCC coder in which a first coder is connected in series with a second coder, and FIG. 5B illustrates a TC coder in which the first coder is connected in parallel with the second coder.

Returning to FIG. 4, the channel-coded data is then processed based on the set parameters (S440). That is, the HARQ transmission processor 450 processes the channel-coded data based upon the set parameters. The HARQ transmission processor 450 may select one ARQ method such as the Stop-And-Wait (SAW) ARQ method, the Selective Repeat (SR) ARQ method, etc. In addition, the HARQ transmission processor 450 improves an error correction function by adjusting the FEC coding rate and also maximizes a time diversity effect by adjusting a puncturing pattern used in the RM. Further, the HARQ transmission processor 450 reduces an error flow by adjusting the interleaver pattern to thus enable packet transmissions with a high reliability.

Next, the processed data is channel-interleaved based on the set parameters (S450). The channel interleaver unit 550 uses a channel interleaver such as a random interleaver, block interleaver, etc. That is, the channel interleaver unit 550 interleaves the processed data to minimize a loss of data even if the data loss is generated during the data transmission. The interleaved data is then mapped to a physical channel to which the data is to be transmitted (S460), and the mapped data is modulated and then transmitted to the desired receiving side mobile terminal (S470).

In more detail, the modulator 650 modulates the mapped data using a mapping method such as a Binary Phase Shift Keying (BPSK) method, a Quadrature Phase Shift Keying (QPSK) method, an 8PSK method, a 16 Quadrature Amplitude Modulation (QAM) method, a 64QAM method, etc. The modulator 650 also transmits the modulated data to a receiving side mobile communications terminal via the antenna 750.

Further, to set the at least one or more predetermined parameters according to various channel states, the mobile terminal provides a corresponding base station with the various channel states via a Channel Quality Indicator (CQI). A method for transmitting the CQI will be explained with reference to FIG. 6.

Figure 6:
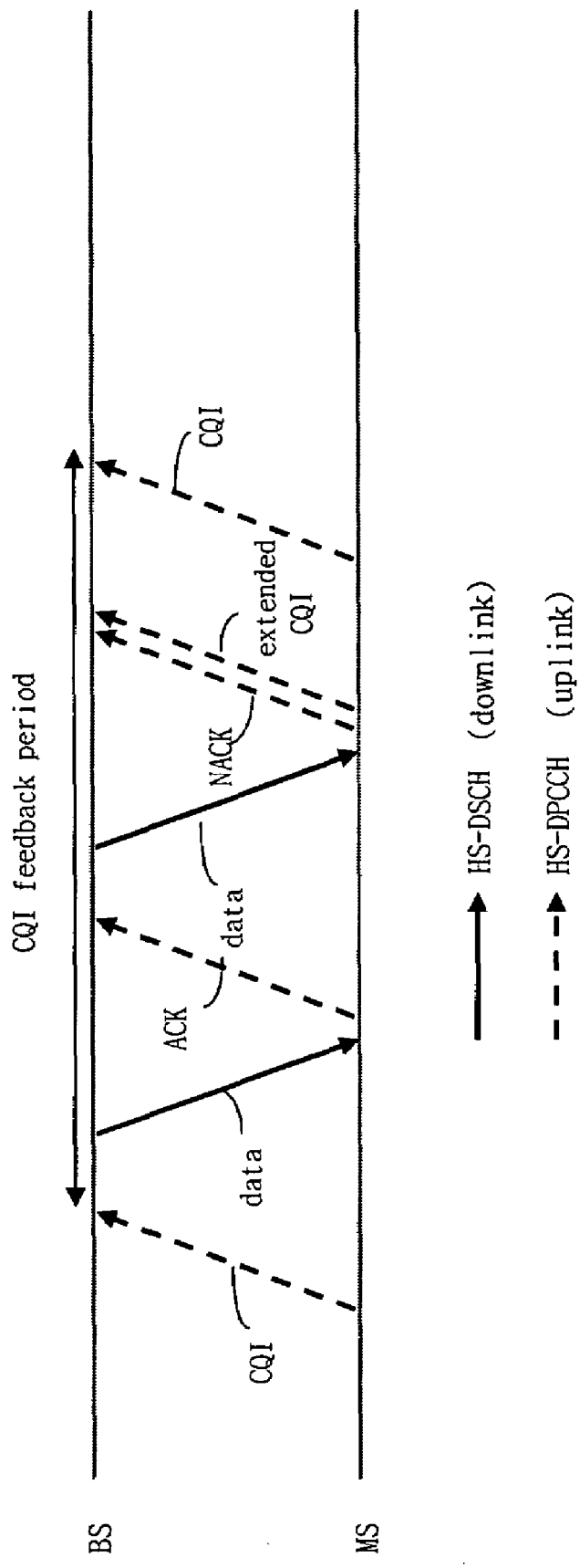
FIG. 6 is a overview illustrating a CQI (Channel Quality Indicator) transmitting method for supporting extended link adaptation techniques in accordance with an embodiment of the present invention.

As illustrated in FIG. 6, the transmitting side mobile terminal transmits an extended CQI corresponding to a transmittal NACK, which indicates a packet loss. The terminal also periodically transmits the CQI to the base station. Thus, the transmitting mobile terminal informs the base station about the channel state using the extended CQI, and accordingly can change the at least one or more set parameters based upon the transmitted extended CQI. In addition, a High Speed-Downlink Shared Channel (HS-DSCH) denotes a downlink high data channel, and a High Speed-Dedicated Physical Control Channel (HS-DPCCH) denotes an uplink control channel which contains information required for the HS-DSCH processing.

Figure 7:
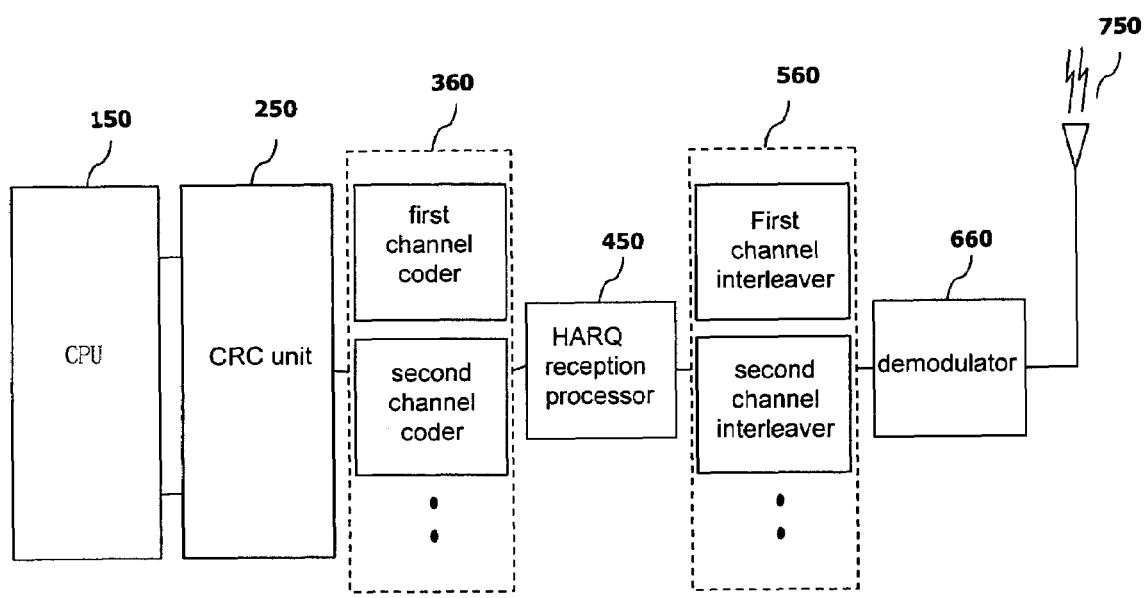
FIG. 7 is a block diagram illustrating a receiving side mobile terminal for supporting extended link adaptation techniques in accordance with an embodiment of the present invention.

Turning next to FIG. 7, which is a block diagram of a receiving mobile terminal for supporting the extended link adaptation techniques in accordance with an embodiment of the present invention. As shown, the receiving mobile terminal includes substantially the same components as the transmitting mobile terminal (i.e., the CPU 150, the CRC unit 250, the HARQ processor 450 and the antenna 750). The receiving terminal also includes a demodulator 660 for demodulating the received data, a channel interleaver unit 560 including at least one or more channel deinterleavers for channel-deinterleaving the demodulated data based upon the set parameters, and a channel decoding unit 360 including at least one or more channel decoders for decoding the processed data based upon the set parameters. The explanation of the receiving terminal for supporting extended link adaptation techniques according to the present invention is similar to that of the transmitting terminal. Accordingly, a detailed explanation of the receiving terminal is omitted.

As described above, the mobile terminal and corresponding method for supporting the extended link adaptation techniques according to the present invention advantageously performs an optimal transmission according to various channel states by changing at least one or more set parameters according to the channel states, so as to enable an efficient usage of the channels according to the changeable radio channel states.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A mobile communication terminal, comprising:
   a Central Processing Unit (CPU) configured to set at least one or more predetermined parameters according to communication channel states;
   a Cyclic Redundancy Checksum (CRC) unit configured to add CRC bits to data to be transmitted based on the set at least one or more predetermined parameters and to then packet the data having the CRC bits;
   a channel coding unit including at least first and second channel coders configured to differently channel-code the packeted data based on the set at least one or more predetermined parameters;
   a Hybrid Automatic Repeat reQuest (HARQ) transmission/reception processor configured to process the channel-coded data output from the channel coding unit based on the set at least one or more predetermined parameters;
   a channel interleaver unit including at least first and second channel interleavers configured to differently channel-interleave the processed data output by the HARQ transmission/reception processor;
   a modulator configured to modulate the channel-interleaved data; and
   an antenna configured to transmit the modulated data,
   wherein the CPU is further configured to select one of the first or second channel coders based on the set at least one or more predetermined parameters before channel-coding the packeted data and to select one of the first and second channel interleavers based on the set at least one or more predetermined parameters before channel-interleaving the processed data such that the modulated data is transmitted using different channel-coding and channel-interleaving methods based on the set at least one or more predetermined parameters.

2. The terminal of claim 1, wherein the at least one or more predetermined parameters include a Forward Error Correction (FEC) coding rate, Rate Matching (RM) patterns, different interleaving patterns and different ARQ methods.

3. The terminal of claim 2, wherein the different channel-coding methods include a block Code (BC), a Convolutional Code (CC), a Turbo Code (TC), a Serial Concatenated Convolutional Code (SCCC) and Turbo-Like Code (TLC).

4. The terminal of claim 2, wherein the different channel-interleaving methods include random interleavers and block interleavers.

5. The terminal of claim 2, wherein the different ARQ methods include a Stop-And-Wait (SAW) ARQ method and a Selective Repeat (SR) ARQ method.

6. The terminal of claim 1, wherein the HARQ transmission/reception processor includes:
   a HARQ transmission processor configured to process data to be transmitted based on the set at least one or more predetermined parameters; and
   a HARQ reception processor configured to process received data based on the set at least one or more predetermined parameters.

7. The terminal of claim 1, further comprising:
   an antenna configured to receive data;
   a demodulator configured to demodulate the received data; and
   a channel deinterleaver unit including at least one or more channel deinterleavers configured to channel-deinterleave the demodulated data and to output the channel-deinterleaved data to the HARQ transmission/reception processor.

8. The terminal of claim 7, further comprising:
   a channel decoding unit including at least one or more channel decoders configured to channel-decode the processed data; and
   a CRC unit configured to extract CRC bits from the channel-decoded data and to unpack the data.

9. The terminal of claim 1, wherein the CPU is further configured to change the at least one or more parameters according to the communication channel states.

10. The terminal of claim 1, wherein the CPU is further configured to transmit information related to the communication channel states via a Channel Quality Indicator (CQI).

11. A mobile communication method, comprising:
    setting, via Central Processing Unit (CPU), at least one or more predetermined parameters according to communication channel states;
    adding Cyclic Redundancy Checksum (CRC) bits to data to be transmitted based on the set at least one or more predetermined parameters and packeting the data having the CRC bits;
    differently channel-coding the packeted data using at least first and second channel coders based on the set at least one or more predetermined parameters;
    processing the channel-coded data based on the set at least one or more predetermined parameters;
    differently channel-interleaving the processed data using at least first and second channel interleavers based on the set at least one or more predetermined parameters;
    modulating the channel-interleaved data; and
    transmitting, via an antenna, the modulated data,
    wherein the channel-coding step comprises selecting one of the first or second channel coders based on the set at least one or more predetermined parameters before channel-coding the packeted data, and the channel-interleaving step comprises selecting one of the first and second channel interleavers based on the set at least one or more predetermined parameters before channel-interleaving the processed data such that the modulated data is transmitted using different channel-coding and channel-interleaving methods based on the set at least one or more predetermined parameters.

12. The method of claim 11, wherein the at least one or more predetermined parameters include a Forward Error Correction (FEC) coding rate, Rate Matching (RM) patterns, different interleaving patterns and different ARQ methods.

13. The method of claim 12, wherein the different channel-coding methods include a block Code (BC), a Convolutional Code (CC), a Turbo Code (TC), a Serial Concatenated Convolutional Code (SCCC) and Turbo-Like Code (TLC).

14. The method of claim 12, wherein the different channel-interleaving methods include random interleavers and block interleavers.

15. The method of claim 12, wherein the different ARQ methods include a Stop-And-Wait (SAW) ARQ method and a Selective Repeat (SR) ARQ method.

16. The method of claim 11, further comprising:
receiving data;
demodulating the received data; and
channel-deinterleaving the demodulated data and outputting the channel-deinterleaved data to the processing step.

17. The method of claim 16, further comprising:
channel-decoding the processed data; and
extracting CRC bits from the channel-decoded data and unpacking the data.

* * * * *